(12) United States Patent
Liao

(10) Patent No.: US 12,381,194 B2
(45) Date of Patent: Aug. 5, 2025

(54) PACKAGE HAVING EMBEDDED DECOUPLING CAPACITOR AND METHOD OF FORMING THE SAME

(71) Applicant: Taiwan Semiconductor Manufacturing Company, Ltd., Hsinchu (TW)

(72) Inventor: Wen-Shiang Liao, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 706 days.

(21) Appl. No.: 17/578,469

(22) Filed: Jan. 19, 2022

(65) Prior Publication Data

US 2023/0230970 A1 Jul. 20, 2023

(51) Int. Cl.
| | |
|---|---|
| *H01L 25/18* | (2023.01) |
| *H01L 23/00* | (2006.01) |
| *H01L 23/48* | (2006.01) |
| *H10D 1/68* | (2025.01) |

(52) U.S. Cl.
CPC ............ *H01L 25/18* (2013.01); *H01L 23/481* (2013.01); *H01L 24/80* (2013.01); *H10D 1/68* (2025.01); *H01L 2224/80895* (2013.01); *H01L 2224/80896* (2013.01)

(58) Field of Classification Search
CPC ..... H01L 25/18; H01L 24/80; H01L 25/0657; H01L 23/481; H01L 2224/80894; H01L 2225/06548; H01L 24/05; H01L 28/40; H01L 2225/06527
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,694,940 B1 * | 7/2023 | Mathuriya ............... | G06F 1/329 257/295 |

(Continued)

FOREIGN PATENT DOCUMENTS

DE 102018124695 A1 * 5/2019 ............. H01L 23/31

*Primary Examiner* — Mamadou L Diallo
(74) *Attorney, Agent, or Firm* — JCIPRNET

(57) ABSTRACT

A package having a capacitor structure and a method of forming the same are provided. The package includes a first die; a second die bonded onto the first die; an isolation region disposed on the first die and laterally encapsulating the second die; at least one first through-via disposed aside the second die and penetrating through the isolation region; an electrode layer disposed on the at least one first through-via; and a capacitor dielectric layer disposed between the at least one first through-via and the electrode layer to separate the at least one first through-via from the electrode layer, wherein the at least one first through-via, the capacitor dielectric layer, and the electrode layer constitute a capacitor structure.

20 Claims, 16 Drawing Sheets

(56) References Cited

U.S. PATENT DOCUMENTS

| | | | |
|---|---|---|---|
| 2019/0148342 A1* | 5/2019 | Hu | H01L 25/105 |
| | | | 257/659 |
| 2020/0152608 A1* | 5/2020 | Hu | H01L 23/5389 |
| 2020/0411455 A1* | 12/2020 | He | G02F 1/133345 |
| 2021/0134704 A1* | 5/2021 | Chen | H01L 23/3114 |
| 2021/0202389 A1* | 7/2021 | Hsieh | H01L 24/96 |
| 2021/0265313 A1* | 8/2021 | Chen | H01L 24/08 |
| 2022/0059546 A1* | 2/2022 | Chang | H10B 12/053 |
| 2022/0344249 A1* | 10/2022 | Xie | H01L 25/16 |
| 2023/0019891 A1* | 1/2023 | Xiao | H10B 12/033 |
| 2023/0207546 A1* | 6/2023 | Alam | H01L 25/50 |
| | | | 257/737 |

\* cited by examiner

PACKAGE HAVING EMBEDDED DECOUPLING CAPACITOR AND METHOD OF FORMING THE SAME

BACKGROUND

Decoupling capacitors can be built into chips to prevent voltage spikes in a power supply such as, for example, when the chip is initially powered or when various components of the chip are activated. In the chip fabrication process, decoupling capacitors can be integrated in the far back end of the line during or after packaging of the chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
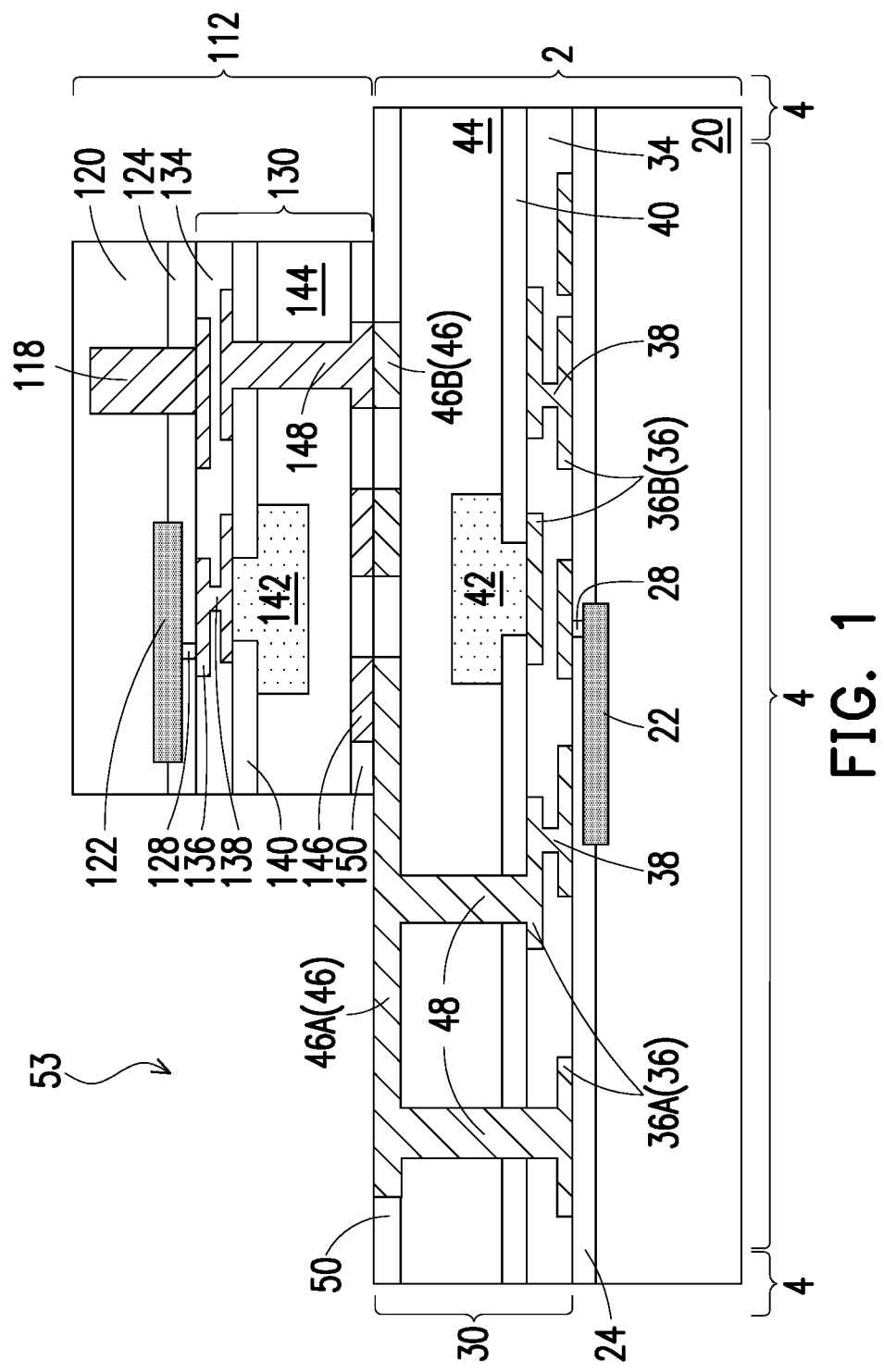
FIG. 1 to FIG. 14 are cross-sectional views of intermediate stages in the manufacturing of a package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures The spatially relative terms are intended to encompass different orientations of the device in use or operation in addition to the orientation depicted in the Figures The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Decoupling capacitors (DeCAP) can be built into chips to prevent voltage spikes in a power supply such as, for example, when the chip is initially powered or when various components of the chip are activated. Since the power supply cannot instantaneously respond to such power demand changes, the chip's power voltage can change for a brief period until the power supply can respond and stabilize the voltage. Voltage spikes may occur during this transient time. Decoupling capacitors can suppress these voltage spikes. Spike suppression performance can improve with decoupling capacitors that feature higher capacitance.

In a chip fabrication process, decoupling capacitors can be integrated in the far back end of the line during or after packaging of the chip. Decoupling capacitors, for example, can be surface mounted onto a packaging substrate using a surface-mount technology (SMT). However, SMT uses long external interconnects between the packaging substrate and the decoupling capacitors, which are mounted externally. External interconnects or connections can increase time delay, for example the delay between a spike occurrence and spike suppression. The embodiments described herein are directed to a method of forming a decoupling capacitor that can be integrated into a 3D integrated circuit (IC) packaging such as, for example, a system on integrate chip (SoIC) package. Integrating the decoupling capacitor into the 3D IC packaging has the benefit of internal interconnects, which are shorter than external interconnects. In some embodiments, the decoupling capacitor formed as part of a SoIC package is a metal insulator metal (MIM) structure that can include a high dielectric constant (high-k) insulator (e.g., dielectric constant higher than 3.9). Compared to decoupling capacitors mounted on substrates using the SMT technology, an integrated MIM capacitor—according to embodiments described herein—can (i) reduce time delay due to a shorter interconnect length, (ii) have a higher capacitance and a larger capacitance range, (iii) reduce power consumption, (iv) improve operational speed, and (v) reduce packaging footprint.

FIG. 1 to FIG. 14 are cross-sectional views of intermediate stages in the manufacturing of a package in accordance with some embodiments.

FIG. 1 illustrates the bonding a die 112 onto a die 4 of a package component 2. In accordance with some embodiments of the present disclosure, the package component 2 is a device wafer including a plurality of active devices 22, such as transistors and/or diodes, and possibly passive devices such as capacitors, inductors, resistors, or the like. The package component 2 may include a plurality of dies 4 therein, with one of dies 4 illustrated. The dies 4 are alternatively referred to as (device) dies hereinafter. In accordance with some embodiments of the present disclosure, the device die 4 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof. In subsequent discussion, a device wafer is discussed as an exemplary package component 2.

In accordance with some embodiments of the present disclosure, the exemplary wafer 2 includes a semiconductor substrate 20 and the features formed at a top surface of the semiconductor substrate 20. The semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, or the like. The semiconductor substrate 20 may also be a bulk silicon substrate or a Silicon-On-Insulator (SOI) substrate. Shallow Trench Isolation (STI) regions (not shown) may be formed in the semiconductor substrate 20 to isolate the active regions in the semiconductor substrate 20. Although not shown, through-vias may be formed to extend into the semiconductor substrate 20, and the through-vias are used to electrically inter-couple the features on opposite sides of the wafer 2.

In accordance with some embodiments of the present disclosure, the wafer 2 includes a plurality of integrated circuit devices 22, which are formed on the top surface of the semiconductor substrate 20. Exemplary integrated circuit devices 22 may include Complementary Metal-Oxide Semiconductor (CMOS) transistors, resistors, capacitors, diodes, and/or the like. The details of the integrated circuit devices 22 are not illustrated herein.

Inter-Layer Dielectric (ILD) 24 is formed over the semiconductor substrate 20, and fills the space between the gate stacks of transistors (not shown) in the integrated circuit devices 22. In accordance with some exemplary embodiments, the ILD 24 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. The ILD 24 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

A plurality of contact plugs 28 are formed in the ILD 24, and are used to electrically connect the integrated circuit devices 22 to overlying metal lines 36 and vias 38. In accordance with some embodiments of the present disclosure, the contact plugs 28 are formed of a conductive material selected from tungsten, aluminum, copper, titanium, tantalum, titanium nitride, tantalum nitride, alloys therefore, and/or multi-layers thereof. The formation of the contact plugs 28 may include forming contact openings in the ILD 24, filling a conductive material(s) into the contact openings, and performing a planarization (such as Chemical Mechanical Polish (CMP) process) to level the top surfaces of the contact plugs 28 with the top surface of the ILD 24.

An interconnect structure 30 is formed on the ILD 24 and the contact plugs 28. The interconnect structure 30 may include a dielectric layer 34, and metal lines 36 and vias 38 formed in the dielectric layer 34. The dielectric layer 34 may also refer to as an Inter-Metal Dielectric (IMD) layer 34. In accordance with some embodiments of the present disclosure, the dielectric layer 34 may be a multi-layered structure, which at least a lower portion in dielectric layer 34 is formed of a low-k dielectric material having a dielectric constant (k-value) lower than about 3.0 or lower than about 2.5. The dielectric layer 34 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all portions of the dielectric layer 34 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of the dielectric layer 34 includes depositing a porogen-containing dielectric material, and then performing a curing process to drive out the porogen, and hence the remaining dielectric layer 34 becomes porous. Etch stop layers (not shown), which may be formed of silicon carbide, silicon nitride, or the like, are formed between the IMD layers 34, and are not shown for simplicity.

The metal lines (also include metal pads) 36 and vias 38 are formed in the dielectric layer 34. The metal lines 36 at a same level are collectively referred to as a metal layer hereinafter. In accordance with some embodiments of the present disclosure, the interconnect structure 30 includes a plurality of metal layers that are interconnected through vias 38. The metal lines 36 and vias 38 may be formed of copper or copper alloys, and they may also be formed of other metals. The formation process may include single damascene and dual damascene processes. In an exemplary single damascene process, a trench is first formed in one of the dielectric layers 34, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

Figure 4:
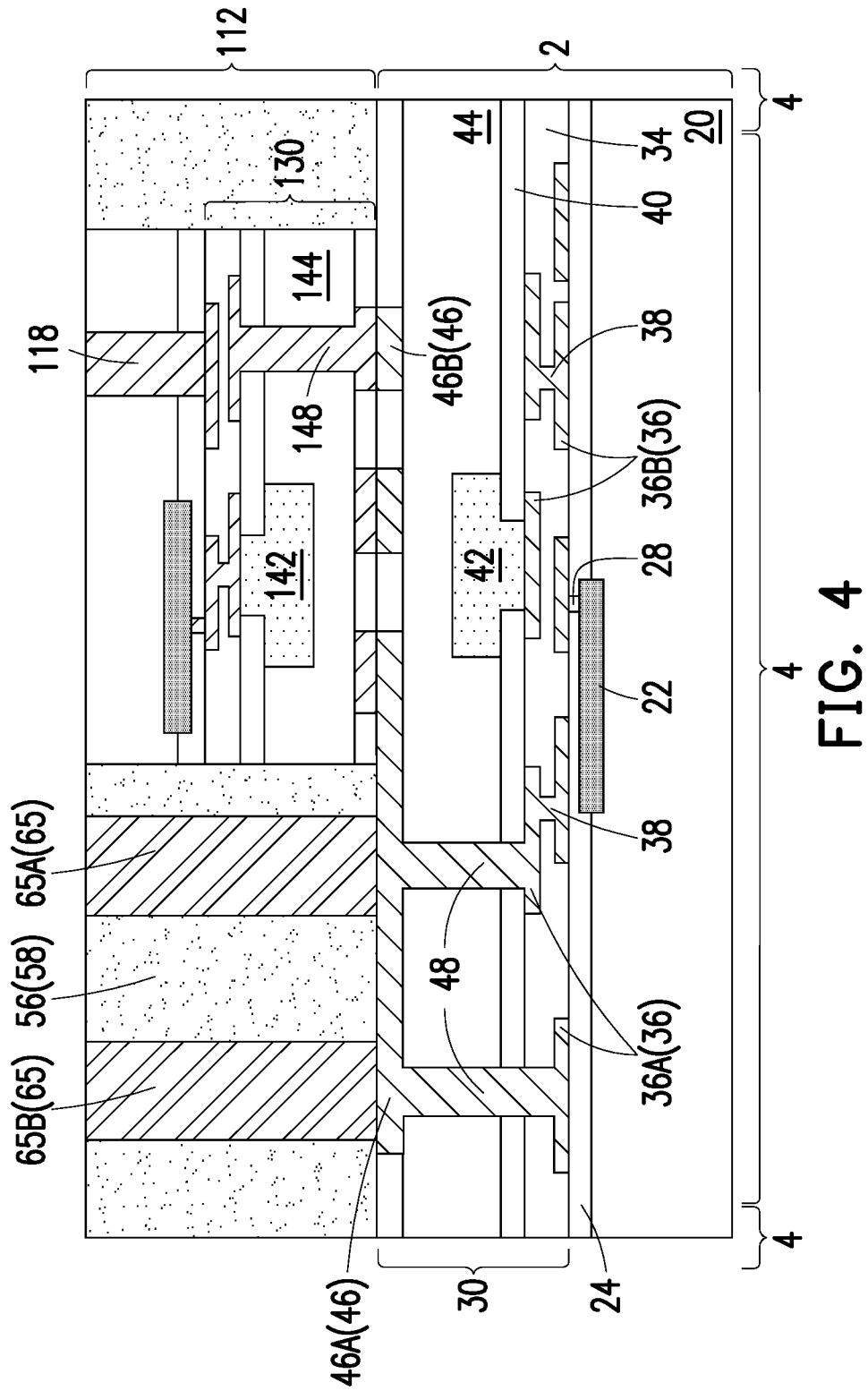

The metal lines 36 include metal lines 36A and 36B. In detail, as shown in FIG. 1, the metal lines 36A may be referred to as power rail or power grid to provide the power voltage to overlying through-vias 65 (FIG. 4). The metal lines 36B may be referred to as signal metal layers to provide the input signal to overlying die 112 (FIG. 1).

In accordance with some embodiments of the present disclosure, dielectric layers 40, 44, and 50 are formed over the top metal lines 36. The dielectric layers 40 and 50 may be formed of silicon oxide, silicon oxynitride, silicon oxycarbide, or the like. The dielectric layer 44 is formed of a dielectric material different from the dielectric material of the dielectric layers 40 and 50. For example, the dielectric layer 44 may be formed of a low-k dielectric material, which may be selected from the similar materials of the underlying IMD layers 34; while the dielectric layers 40 and 50 may be formed of silicon nitride, silicon carbide, or the like.

Vias 48 and metal pads 42, 46A, and 46B are formed in dielectric layers 40, 44, and 50. The metal pads 46A and 46B may be collectively and individually referred to as metal pads 46 hereinafter. The vias 48 and metal pads 46 may be formed using a dual damascene process, which includes forming via openings in the dielectric layers 40 and 44, trenches in the dielectric layer 50, and filling the via openings and trenches with conductive materials. A planarization process such as a CMP process or a mechanical grinding process is performed to level the top surfaces of the dielectric layer 50 and the metal pads 46. The filling of the conductive materials may include depositing a diffusion barrier such as a titanium nitride layer, a tantalum nitride layer, a titanium layer, a tantalum layer, or the like, and depositing a copper-containing material over the diffusion barrier.

In addition, the metal pad 42 may be formed in the dielectric layer 40 to electrically connect to the metal lines 36B of the interconnect structure 30. In accordance with some embodiments, a material of the metal pad 42 is different from a material of the metal pads 46. In the present embodiment, the material of the metal pad 42 is softer than the material of the metal pads 46. In accordance with some embodiments, the metal pad 42 may be referred to as a test pad, such as aluminum or aluminum copper pads, for performing a die performance test to identify or select known good die.

In accordance with some embodiments of the present disclosure, there is no organic dielectric material such as polymer layer in the wafer 2. Organic dielectric layers typically have high Coefficients of Thermal Expansion (CTEs), which may be 10 ppm/° C. or higher. This is significantly greater than the CTE of silicon substrate (such as substrate 20), which is about 3 ppm/° C. Accordingly, organic dielectric layers tend to cause the warpage of the wafer 2. Not including organic materials in the wafer 2 advantageously reduces the CTE mismatch between the layers in the wafer 2, and results in the reduction in warpage.

In accordance with some embodiments of the present disclosure, the device die 112 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof. In the embodiment, the die 112 is different from the die 4. For example, the die 112 may be a RF die and the die 4 may be a logic die.

As shown in FIG. 1, the device die 112 includes a semiconductor substrate 120, integrated circuit devices 122, ILD 124, contact plugs 128, and through-silicon vias (TSVs) 118. The TSVs 118 are sometimes referred to as through-semiconductor vias or through-vias, are formed to penetrate through the semiconductor substrate 120 and/or the ILD 124. The TSVs 118 are used to connect the devices and metal lines formed on the front side (the illustrated bottom side) of the semiconductor substrate 120 to the backside. In addition, the device dies 112 further include an interconnect structure 130 for connecting to the integrated circuit devices 122. The interconnect structure 130 may include dielectric layers 134, 140, 144, and 150, metal lines 136, vias 138, metal pads 142, 146, and vias 148. The materials and the formation methods of the dielectric layers 134, 140, 144, and 150, the metal lines 136, the vias 138, the metal pads 142, 146, and the vias 148 may be similar to their corresponding parts in the die 4, and hence the details are not repeated herein.

As shown in FIG. 1, the bonding of the die 112 to the die 4 may be achieved through a hybrid bonding. In detail, the die 112 is further turned upside down and mounted onto the die 4. In some embodiments, the die 112 and the die 4 are face-to-face bonded together by the hybrid bonding. That is, the front side (or active surface) of the die 112 faces toward the front side (or active surface) of the die 4. In some embodiments, before the die 112 is bonded to the die 4, the metal pads 146 and the metal pads 46 are aligned, such that the metal pads 146 may be bonded to the metal pads 46, and the dielectric layer 150 may be bonded to the dielectric layer 50. In such embodiment, the metal pads 146 and 46 may be referred to as bond pads. The bond pads 146 are bonded to the bond pads 46 through metal-to-metal direct bonding. In accordance with some embodiments of the present disclosure, the metal-to-metal direct bonding is copper-to-copper direct bonding. Although one device die 112 is illustrated, there may be a plurality of device dies 112 bonding to the wafer 2, and gaps 53 are left between neighboring device dies 112. Furthermore, the dielectric layer 150 may be bonded to the dielectric layer 50 through dielectric-to-dielectric bonding, which may be fusion bonding, for example, with Si—O—Si bonds generated. To achieve the hybrid bonding, the device die 112 is first pre-bonded to the dielectric layer 50 and the bond pads 46 by lightly pressing the device die 112 against the die 4. An anneal is then performed to incur the inter-diffusion of the metals in the bond pads 46 and the corresponding overlying the bond pads 146.

Figure 2:
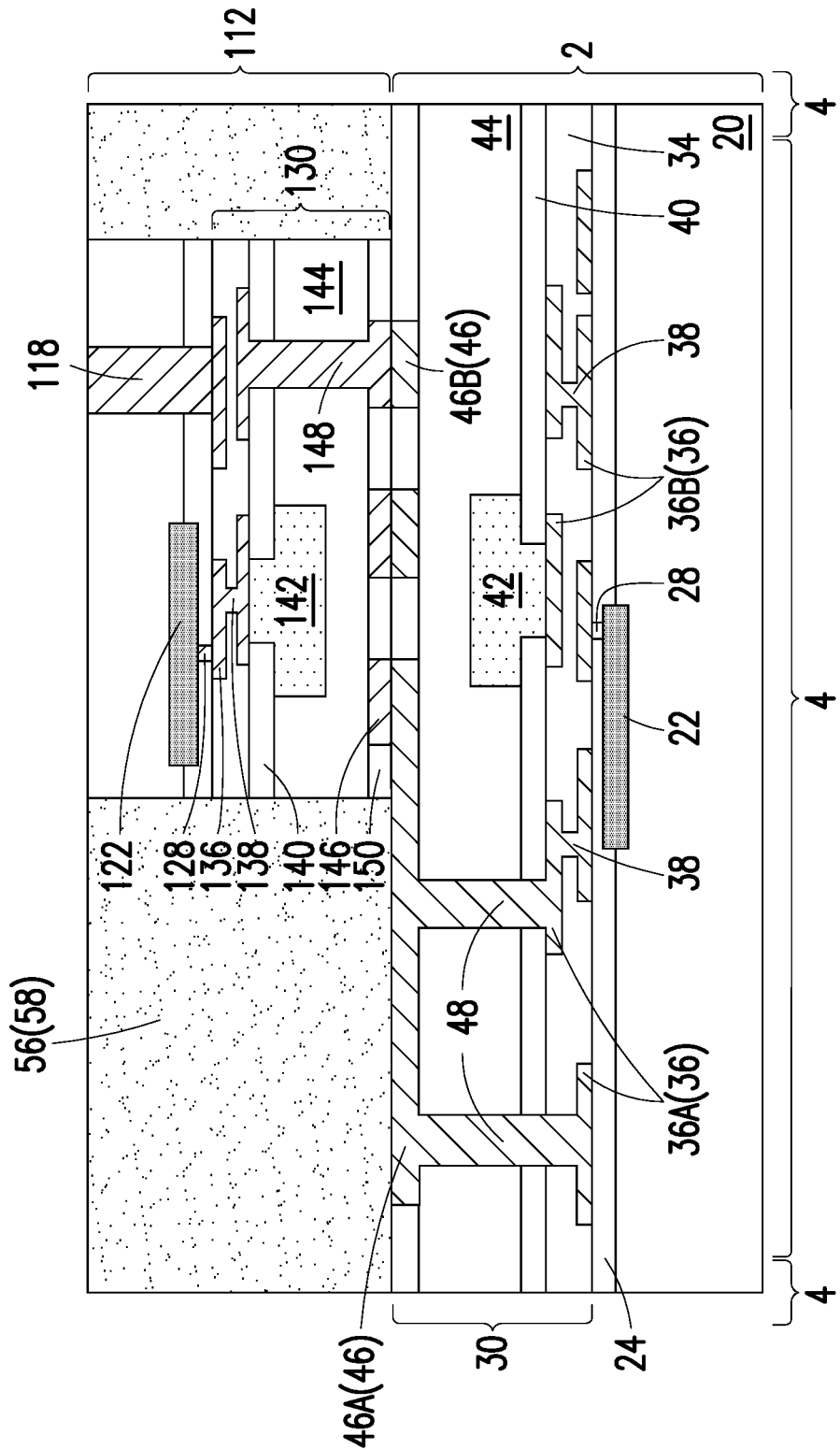

FIG. 2 illustrates the formation of a gap-filling layer 56. In detail, a gap-filling material is formed in the gaps 53 and further cover the backside of the die 112. In some embodiments, the gap-filling material is formed of silicon oxide, which may be formed of TEOS, while other dielectric materials such as silicon carbide, silicon oxynitride, silicon oxy-carbo-nitride, PSG, BSG, BPSG, or the like may also be used. The gap-filling material may be formed using CVD, High-Density Plasma Chemical Vapor Deposition (HDPCVD), Flowable CVD, spin-on coating, or the like. Next, a planarization process such as a CMP process or a mechanical grinding process is performed to remove excess a portion of the gap-filling material, so that the backside of the device die 112 is exposed. Also, the TSVs 118 are exposed. The remaining portions of the gap-filling material are collectively referred to as (gap-filling layer) isolation region 58.

Figure 3:
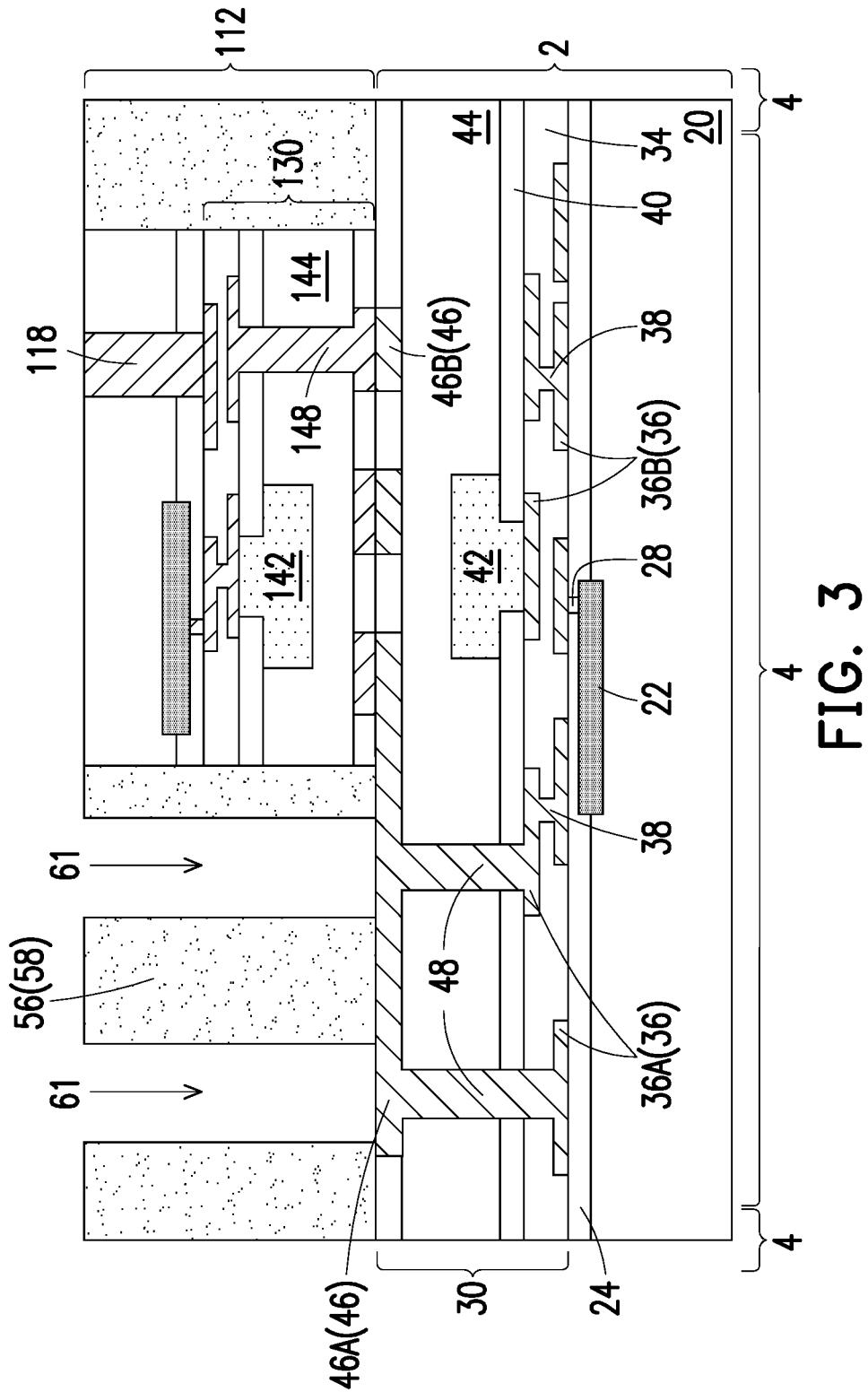

FIG. 3 illustrates the etching of the gap-filling layer 56 to form a plurality of openings 61. In accordance with some embodiments of the present disclosure, a photoresist (not shown) is formed and patterned, and the gap-filling layer 56 are etched by using the patterned photoresist as an etching mask. The openings 61 are thus formed, and extend down to reach the metal pad 46A of the die 4. In accordance with some embodiments of the present disclosure, the gap-filling layer 56 comprises an oxide, and the etching may be performed through dry etching. The etching gas may include a mixture of $NF_3$ and $NH_3$, or a mixture of HF and $NH_3$.

FIG. 4 illustrates the formation of through-dielectric vias (TDVs) 65 (including 65A and 65B), which fills the openings 61 (FIG. 3). The TDVs 65 stand on and electrically couple to the metal pads 46A. In accordance with some embodiments of the present disclosure, the TDVs 65 are formed of a homogenous conductive material, which may be a metal or a metal alloy including copper, aluminum, tungsten, or the like. In accordance with alternative embodiments of the present disclosure, the TDVs 65 have a composite structure including a conductive barrier layer formed of titanium, titanium nitride, tantalum, tantalum nitride, or the like, and a metal-containing material (such as copper, aluminum, tungsten, or the like) over the conductive barrier layer. In accordance with some embodiments of the present disclosure, a dielectric isolation layer is formed to encircle each of the TDVs 65. In accordance with alternative embodiments, no dielectric isolation layers are formed to encircle the TDVs 65, and the TDVs 65 are in physical contact with the gap-filling layer 56. The formation of the TDVs 65 may include depositing the conductive material into the openings 61 (FIG. 3) by performing a plating process such as an electrical-chemical plating process or an electro-less plating process, and performing a planarization process to remove excess portions of the deposited material over the gap-filling layer 56. The TDVs 65 may have substantially straight and vertical sidewalls. Alternatively, the TDVs 65 may have a tapered profile, with top widths slightly greater than the respective bottom widths. After the planarization process, the TDVs 65, the gap-filling layer 65 (or the isolation region 58), and the die 112 have the flush top surface.

Figure 5:
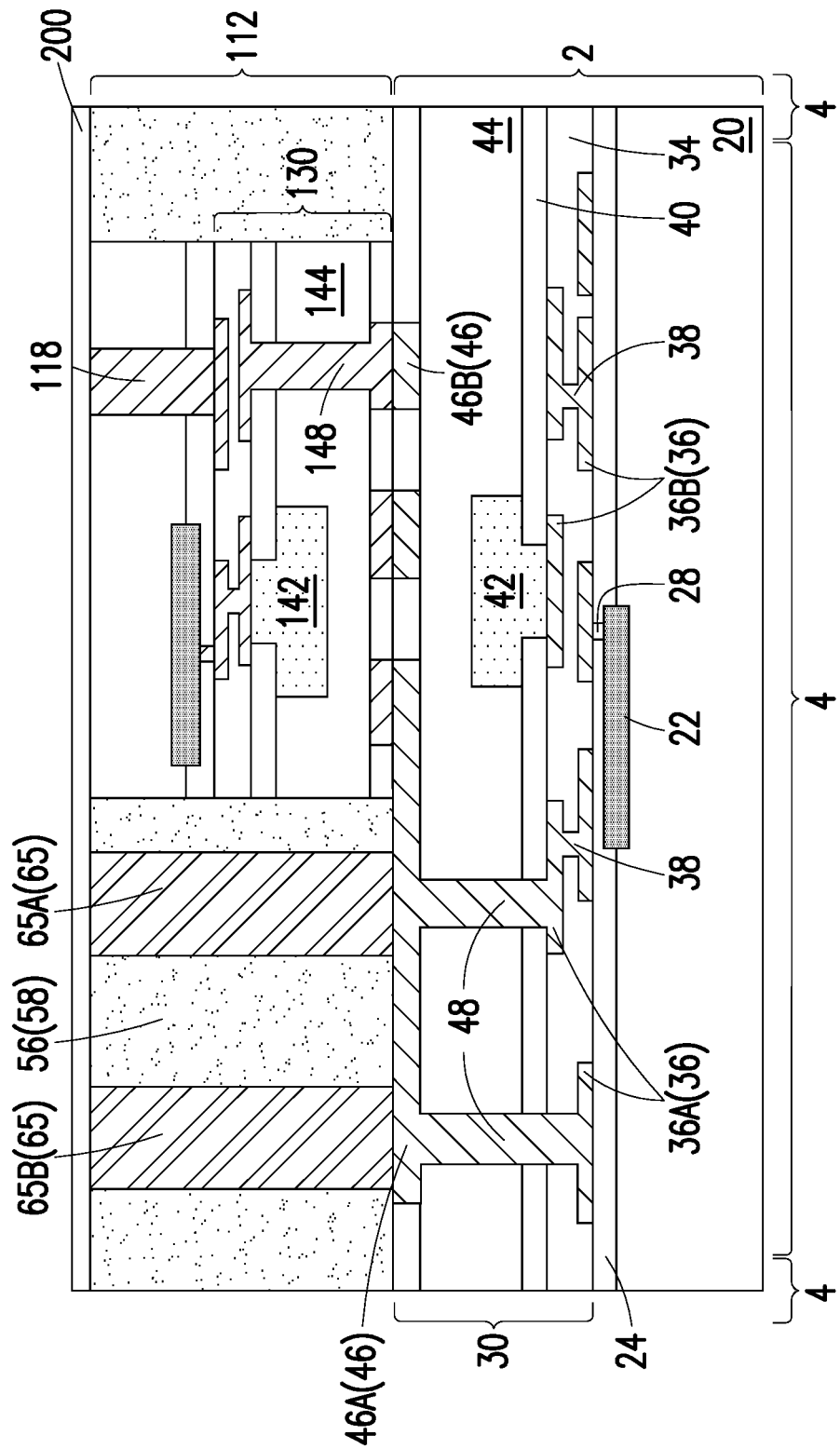

Referring to FIG. 5, a capacitor dielectric material 200 is formed to cover the die 112, the isolation region 58, and the TDVs 65. In some embodiments, the capacitor dielectric material 200 is a high-dielectric constant (high-k) material. By way of example and not limitation, the capacitor dielectric material 200 may have a dielectric constant (k-value) greater than 3.9 (e.g., equal to about 7) depending on the type of material. By way of example and not limitation, the capacitor dielectric material 200 may be a liquid phase high-k polymer, such as PBO or PI, that may be cured and hardened at a temperature below about 250° C. By way of example and not limitation, the capacitor dielectric material 200 may be a spin on glass (SOG) or a liquid phase $SiO_2$ with a low curing temperature (e.g., below about 250° C.) and a k-value between about 4 and about 4.2. By way of example and not limitation, the capacitor dielectric material 200 may be a liquid phase silicon nitride ($SiN_x$) with a dielectric constant of about 6.9, that may be cured and hardened at a temperature below about 250° C. By way of example and not limitation, the capacitor dielectric material 200 may be silicon oxide ($SiO_2$), silicon nitride ($SiN_x$), or silicon oxynitride ($SiON_x$) deposited with low-temperature (e.g., about 180° C.) chemical vapor deposition (CVD), plasma-enhanced CVD (PECVD), atmospheric pressure CVD (APCVD), sub-atmospheric pressure CVD (SACVD), metal organic CVD (MOCVD), etc. In some embodiments, the capacitor dielectric material 200 may be a dielectric stack—which may include a bottom layer of zirconium oxide ($ZrO_2$), a middle layer of aluminum oxide ($Al_2O_3$), a top layer of $ZrO_2$—that can be deposited at a temperature of about 210° C. and have a k-value greater than about 13 (e.g., 13.6). In some alternative embodiments, the capacitor dielectric material 200 may be a stack that includes any high-k dielectric material, such as $ZrO_2$, $Al_2O_3$, hafnium-based dielectrics (e.g., hafnium oxide ($HfO_x$) and hafnium silicate ($HfSiO_x$)), $ZrTiO_x$, titanium oxide ($TiO_2$), tantalum oxide ($TaO_x$), or the like. Additionally, the capacitor dielectric material 200 may be $TiO_2$ with a k-value between 83 and 100, strontium oxide ($SrTiO_3$) with a k-value between 100 and 200, barium-titanium oxide ($BaTiO_3$) with a k-value of about 500, barium-strontium-titanium oxide ($BaSrTiO_3$) with a k-value of between about 500 to 1000, or lead-zirconium-titanium oxide ($PbZrTiO_3$) with a k-value of about 1000, or the like.

According to some embodiments, for a fixed capacitance of the MIM capacitor, the thickness of the capacitor dielectric material 200 may be larger for dielectric materials with higher k-value. In addition, higher-k value materials can provide higher capacitance values for the MIM structure that has a fixed distance and area between the capacitor's plates according to the following parallel plate capacitance formula:

$$C = k\varepsilon_o \frac{A}{d}$$

where C is the capacitance of the MIM structure, k is the dielectric constant of the insulator in the MIM structure (e.g., the dielectric constant of the capacitor dielectric material 200), $\varepsilon_0$ is the dielectric constant of free space, A is area of the plates in the MIM structure, and d is the distance between the plates of the MIM structure (e.g., the thickness of the capacitor dielectric material 200).

Figure 6:
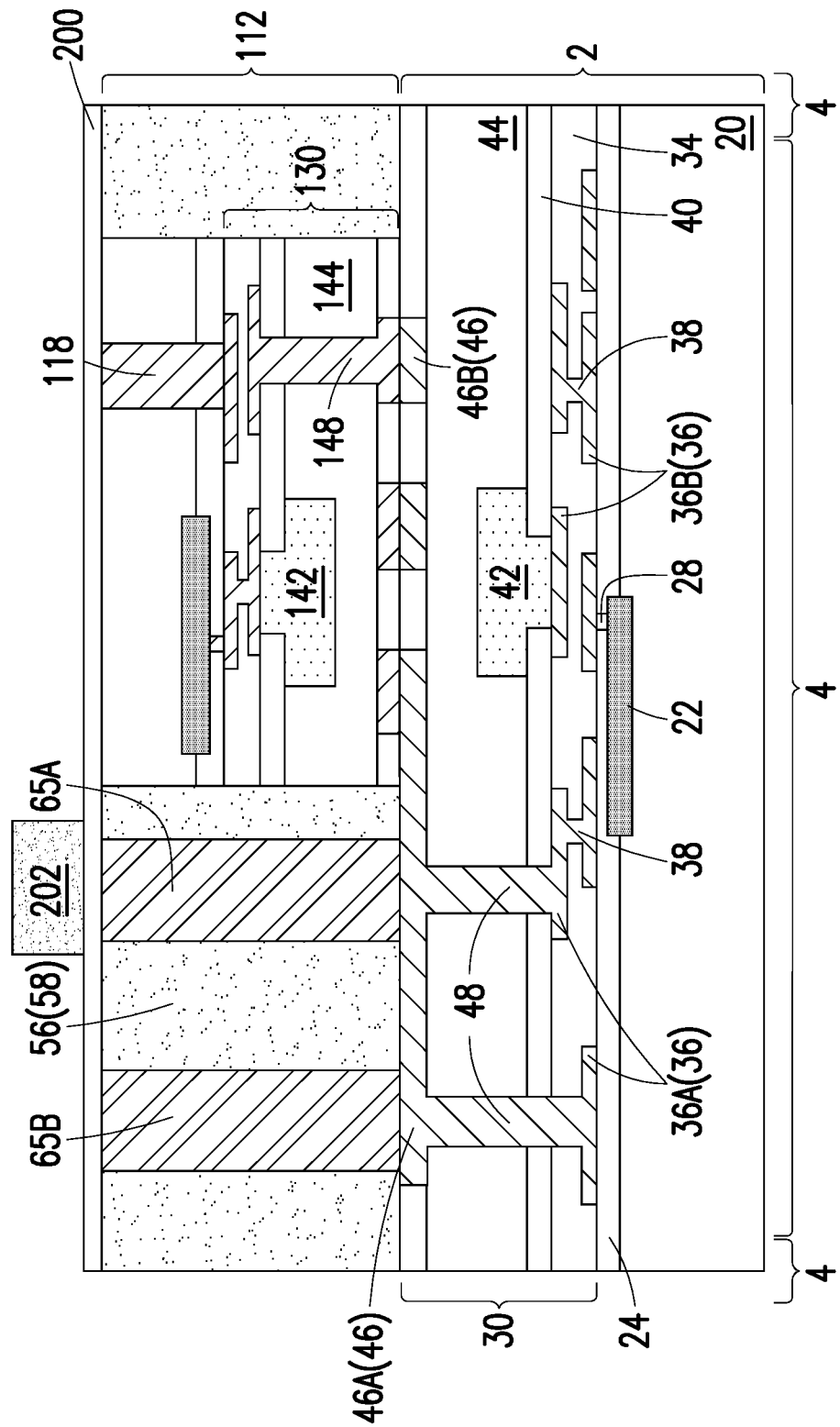
Figure 7:
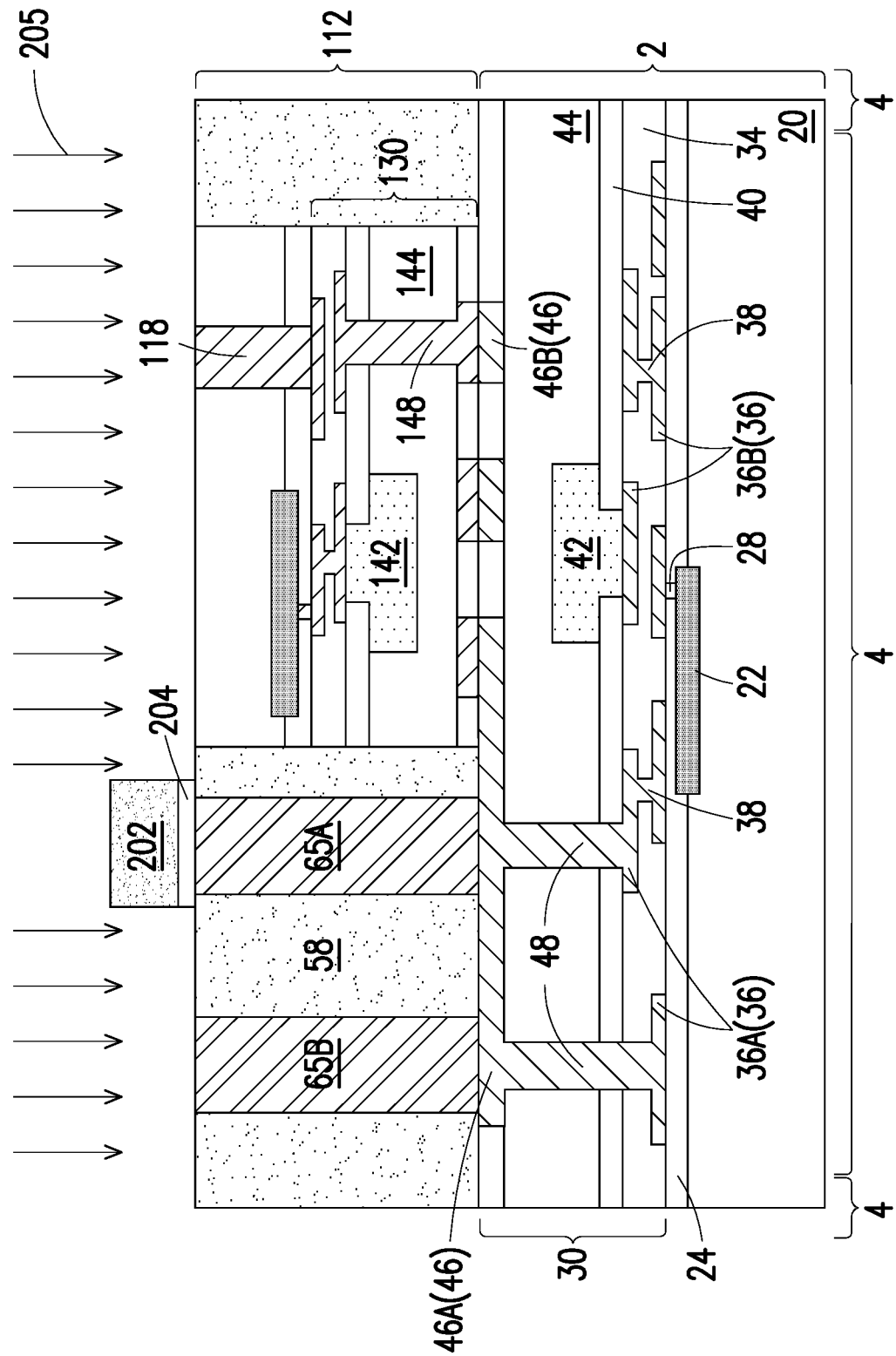

Referring to FIG. 6 and FIG. 7, a photoresist pattern 202 is formed on the capacitor dielectric material 200. In detail, the photoresist pattern 202 may correspond to the underlying TDV 65A. Next, an etching process 205 is performed on the capacitor dielectric material 200 by using the photoresist pattern 202 as a mask to remove a portion of the capacitor dielectric material 200. In this case, the capacitor dielectric material 200 is patterned to expose the top surface of the die 112, thereby forming a capacitor dielectric layer 204. As shown in FIG. 7, the capacitor dielectric layer 204 may completely cover the underlying TDV 65A and further extends to cover a portion of the isolation region 58. That is, the capacitor dielectric layer 204 may have a width greater than a width of the TDV 65A.

Figure 8:
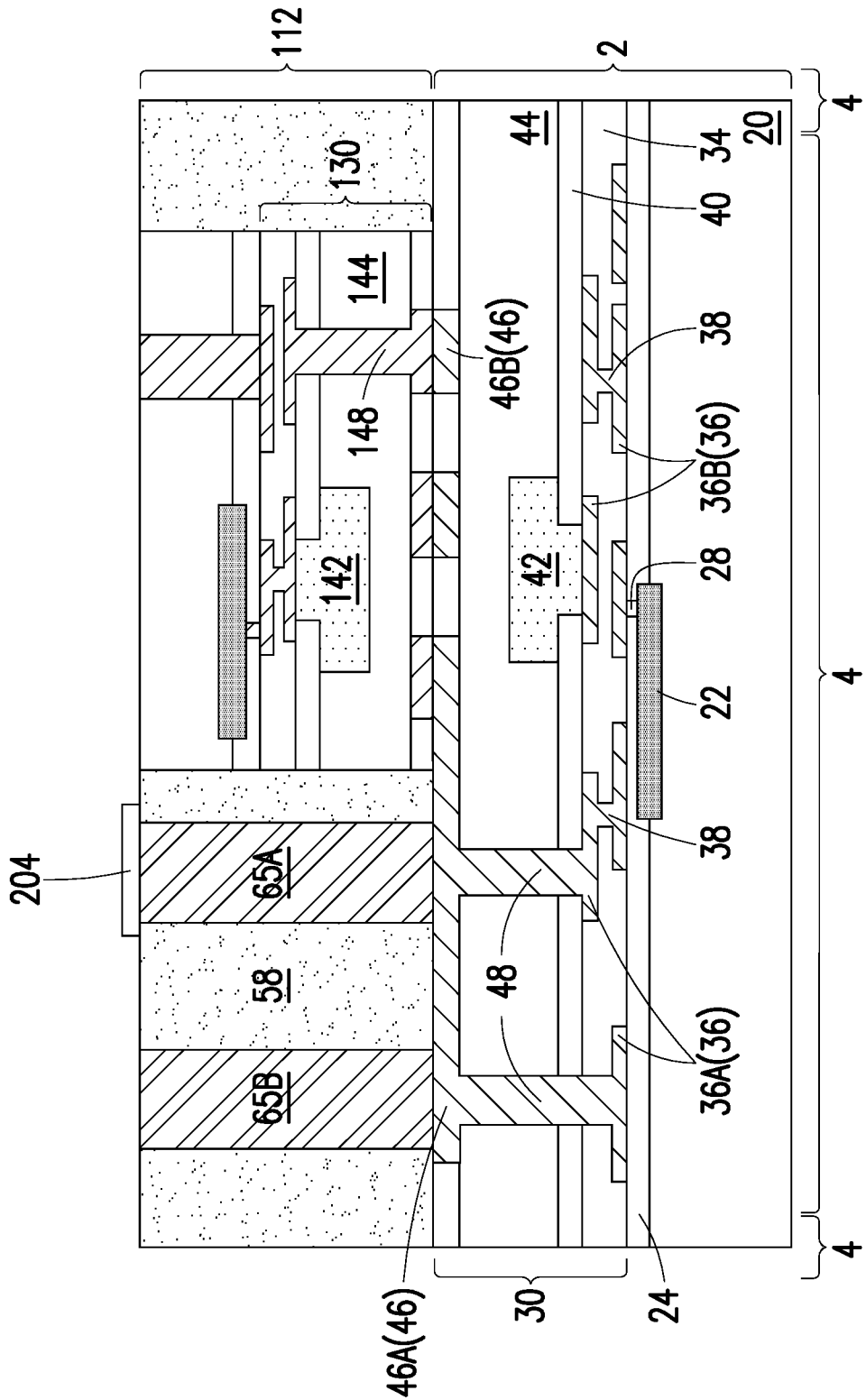

Referring to FIG. 8, after forming the capacitor dielectric layer 204, the photoresist pattern 202 is removed to expose the capacitor dielectric layer 204. In this case, the capacitor dielectric layer 204 is formed on and in direct contact with the top surface of the TDV 65A. In some embodiments, the photoresist pattern 202 is removed by an acceptable ashing or stripping process, such as using an oxygen plasma or the like.

Figure 9:
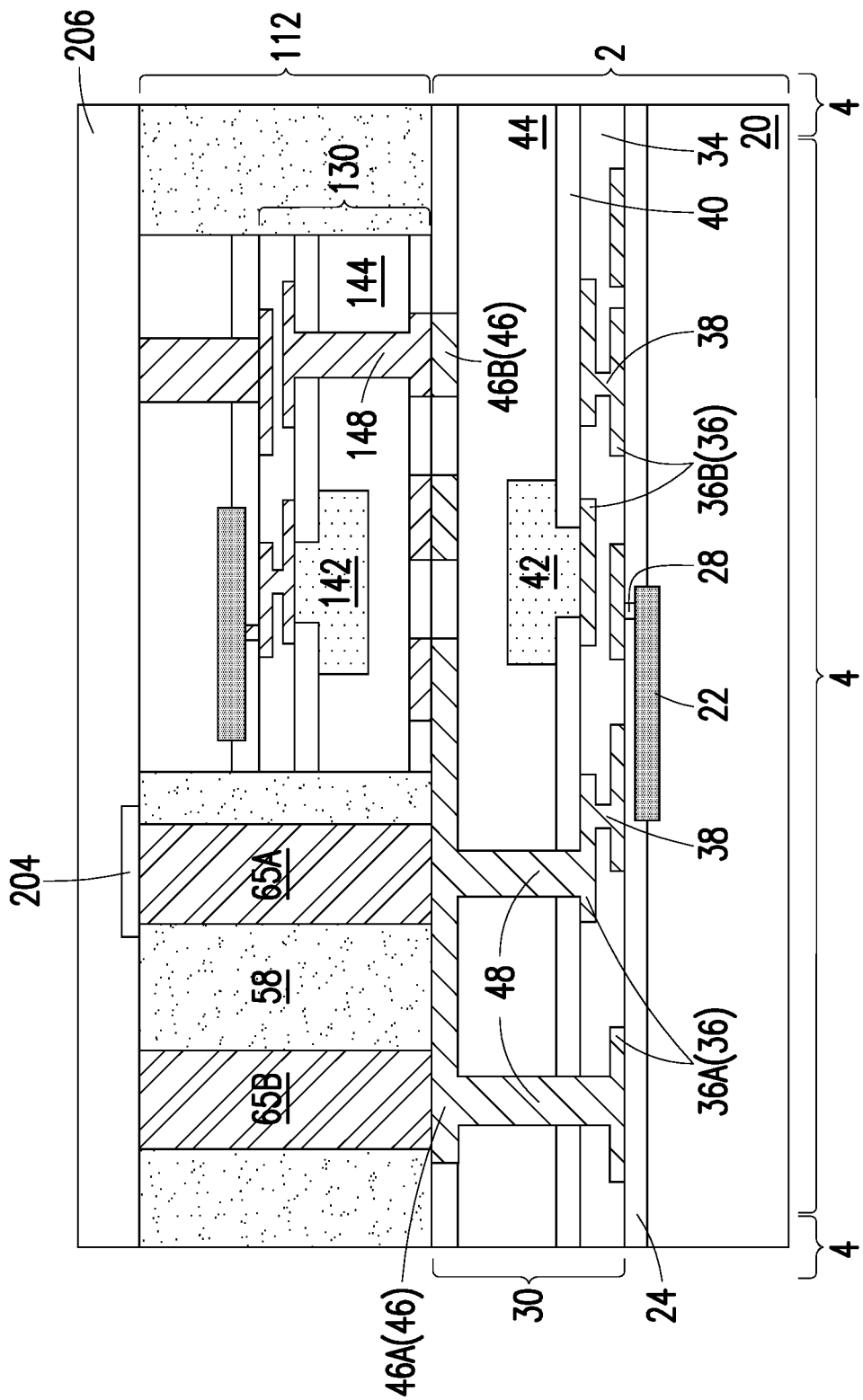

Referring to FIG. 9, a dielectric layer 206 is formed to cover the capacitor dielectric layer 204, the die 112, the isolation region 58, and the TDV 65B. In some embodiments, the dielectric layer 206 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 206 includes low-k dielectric materials that have a dielectric constant less than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the dielectric layer 206 include one or more dielectric materials. In some embodiments, the dielectric layer 206 is formed by any suitable method, such as CVD, spin-on, or the like.

Figure 10:
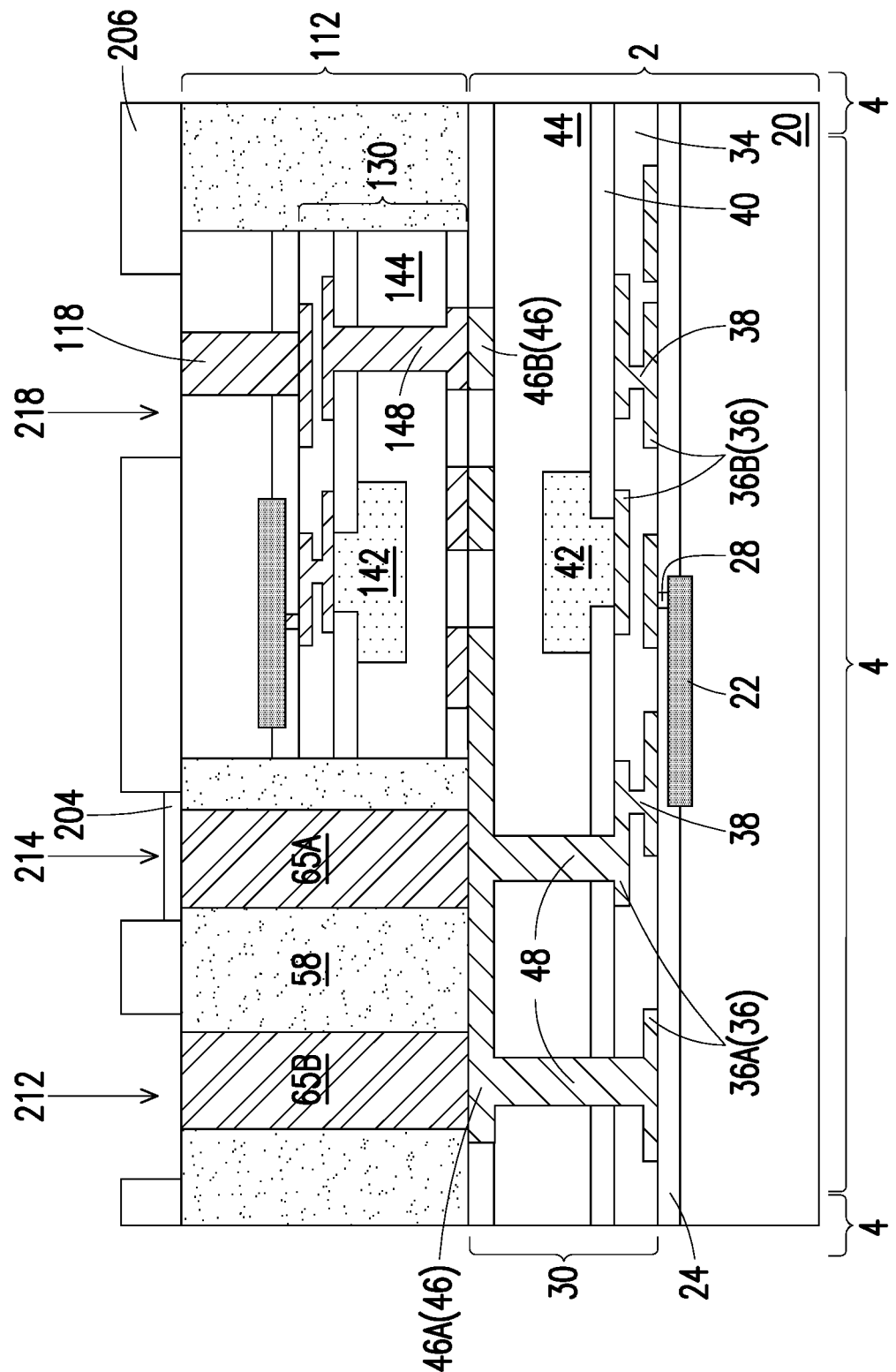

Referring to FIG. 10, a dielectric layer 206 is patterned to form a plurality of openings 212, 214, and 218. In detail, the opening 212 may expose the TDV 65B, the opening 214 may expose the capacitor dielectric layer 204, and the opening 218 may expose the TSV 118 of the die 112. In some embodiments, the opening 214 has a width less than or substantially equal to a width of the underlying capacitor dielectric layer 204 to avoid the short between to-be-formed electrode layer 224 (FIG. 11) and the TDV 65A.

Figure 11:
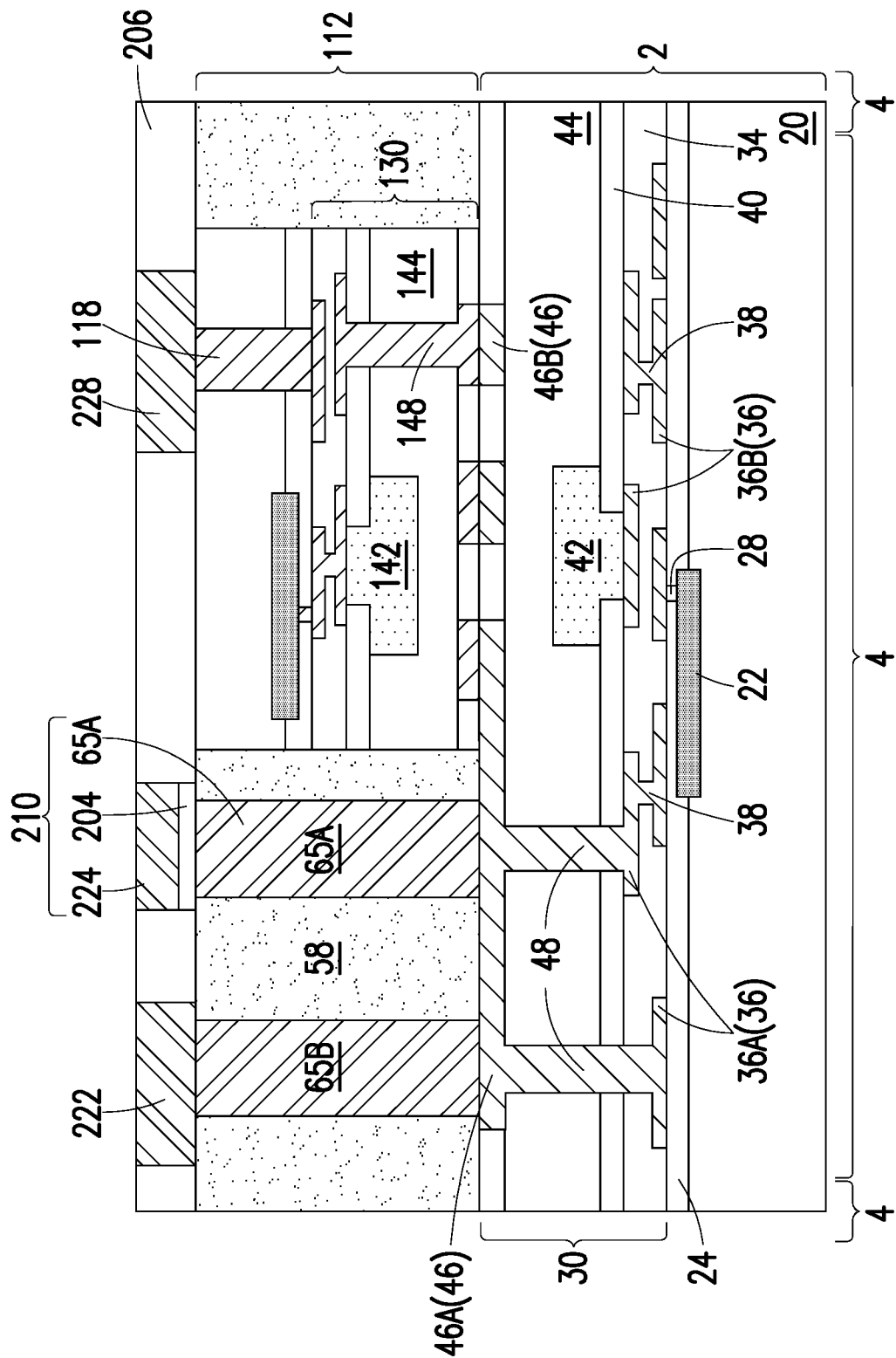

Referring to FIG. 11, a conductive material is formed to fill in the openings 212, 214, and 218. A planarization process is then performed on the conductive material to remove the excess portions of the conductive material higher than the top surface of the dielectric layer 204, thereby forming a conductive layer 222 in the opening 212, an electrode layer 224 in the opening 214, and a conductive layer 228 in the opening 218. In some embodiments, the conductive material may be formed of copper or copper alloys, and they may also be formed of other metals. In some alternative embodiments, the conductive material may include a diffusion barrier and a copper-containing metallic material over the diffusion barrier. The diffusion barrier may include titanium, titanium nitride, tantalum, tantalum nitride, or the like.

After forming the electrode layer 224, a capacitor structure 210 is accomplished. In detail, the capacitor structure 210 may include the TDV 65A (also referred to as lower electrode), the electrode layer 224 (also referred to as upper electrode), and the capacitor dielectric layer 204 between the TDV 65A and the electrode layer 224. As shown in FIG. 11, the TDV 65A penetrates through the isolation region 58, is disposed aside the die 112, and stands on the metal pad 46A of the wafer 2. The TDV 65B also penetrates through the isolation region 58, is disposed aside the TDV 65A, and stands on the same metal pad 46A of the wafer 2. That is, the TDV 65A and TDV 65B are electrically connected to each other by the metal pad 46A. In some embodiments, the TDV 65A, the TDV 65A, the isolation region 58, and the die 112 have the same height. In some embodiments, the electrode layer 224 has a width less than or substantially equal to the width of the underlying capacitor dielectric layer 204.

By way of example and not limitation, the capacitor structure 210, as depicted in FIG. 11, includes only one TDV 65A. However, two or more TDVs may be possible. That is, two or more through-vias may be connected to the bottom surface of the same capacitor dielectric layer 204. In some embodiments, the number of TDVs is proportional to the capacitance of the capacitor structure 210. For example, a fewer number of the TDV 65A may result in lower capacitance for the capacitor structure 210 (due to smaller capacitor plate area A), and conversely, a larger number of the TDV 65A may result in higher capacitance for the capacitor structure 210 (due to larger capacitor plate area A).

Figure 12:
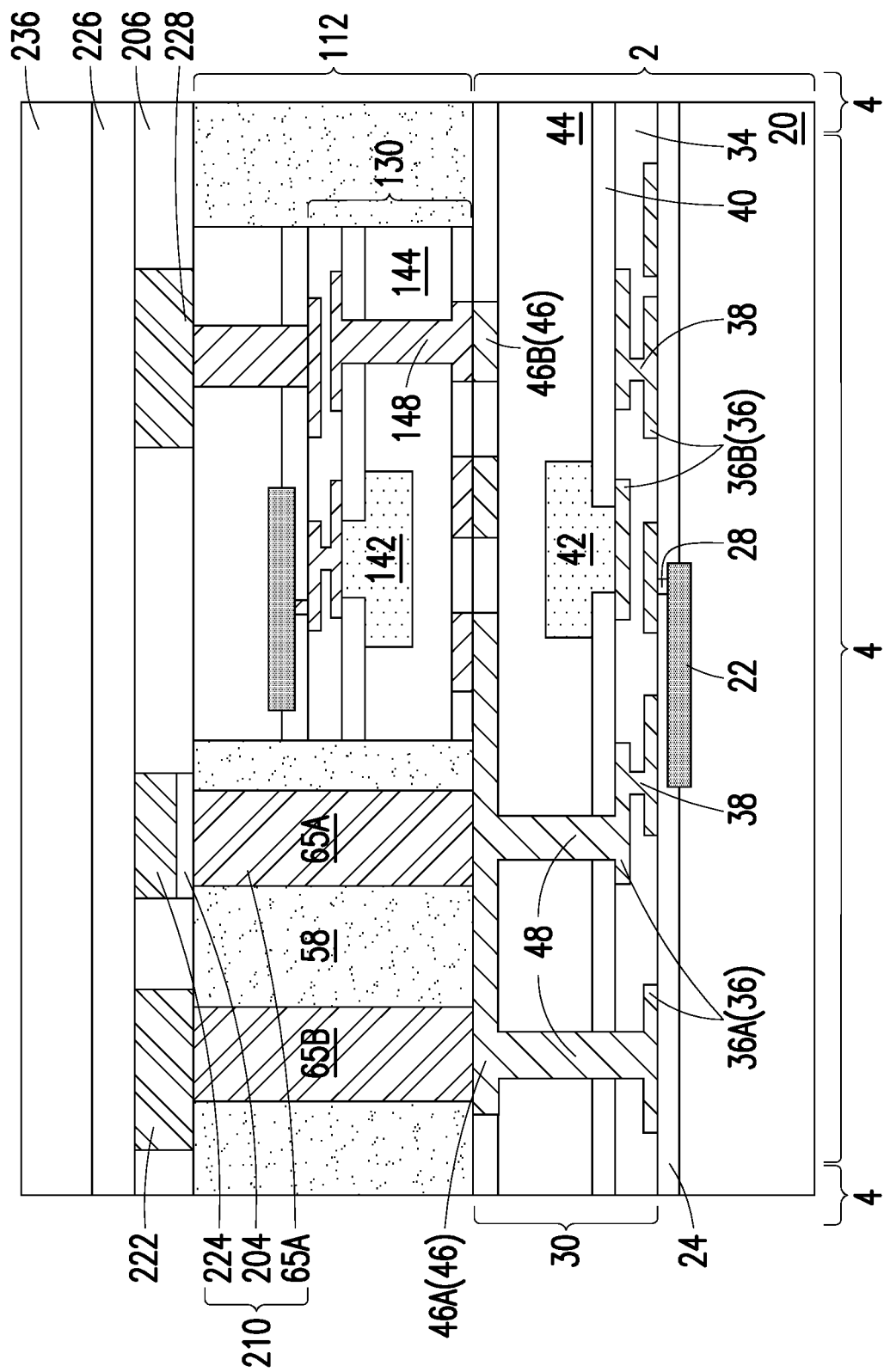

Referring to FIG. 12, a dielectric layer 226 and a passivation layer 236 are formed on the dielectric layer 206. In some embodiments, the dielectric layer 226 includes a dielectric material, such as silicon oxide, silicon nitride, silicon oxynitride, or a combination thereof. The passivation layer 236 may include a polymer material, such as polyimide, polybenzoxazole (PBO), or the like. In the present embodiment, the dielectric layer 226 and the passivation layer 236 have different material. For example, the dielectric layer 226 may be a silicon nitride layer with a thickness of about 6000 Å, and the passivation layer 236 may be a polyimide layer with a thickness of 2.5 μm to 5 μm.

Figure 13:
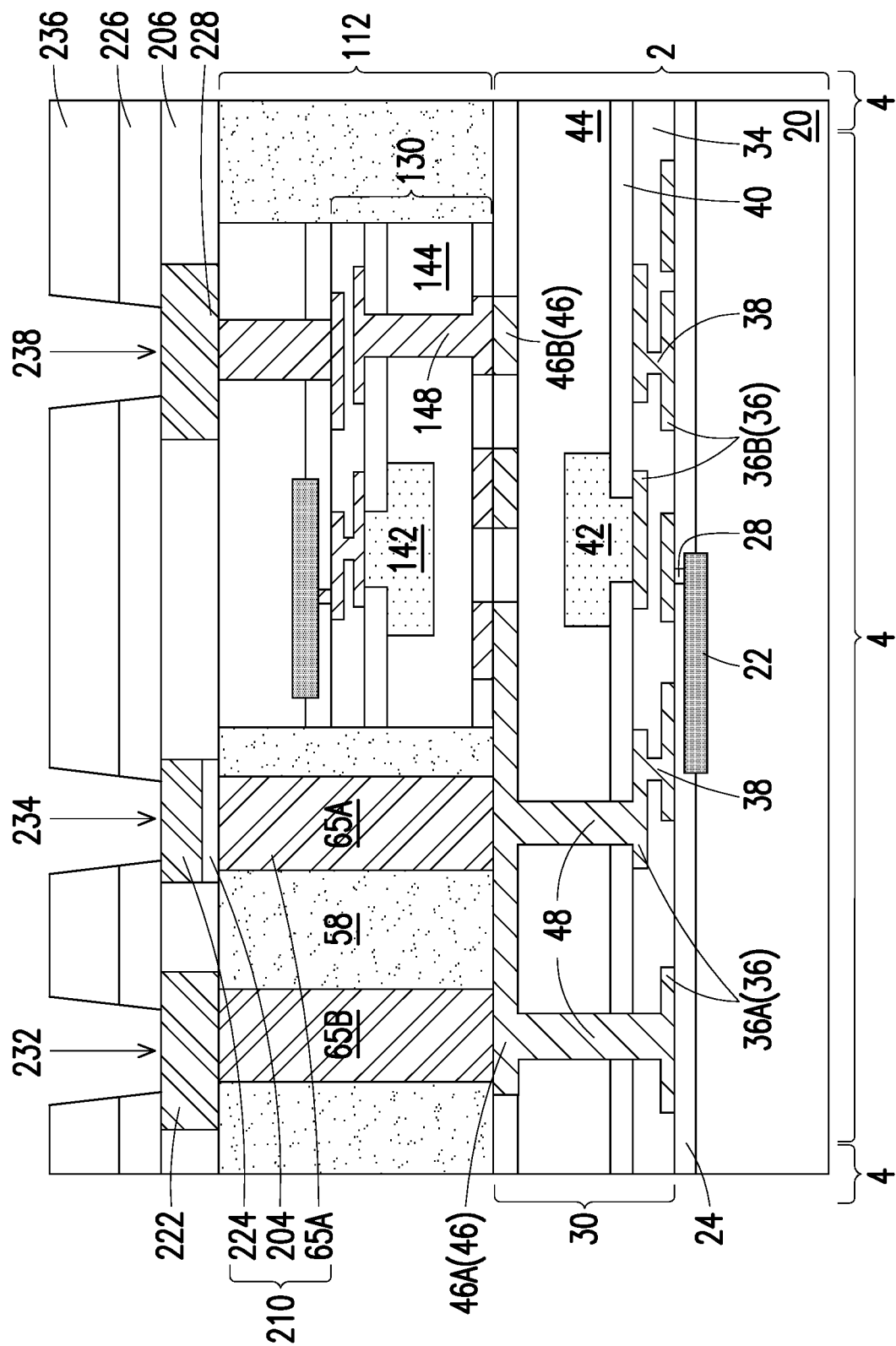

Referring to FIG. 13, the dielectric layer 226 and the passivation layer 236 are patterned to form a plurality of openings 232, 234, and 238. In detail, the opening 232 may expose the conductive layer 222, the opening 234 may expose the electrode layer 224, and the opening 238 may expose the conductive layer 228.

Figure 14:
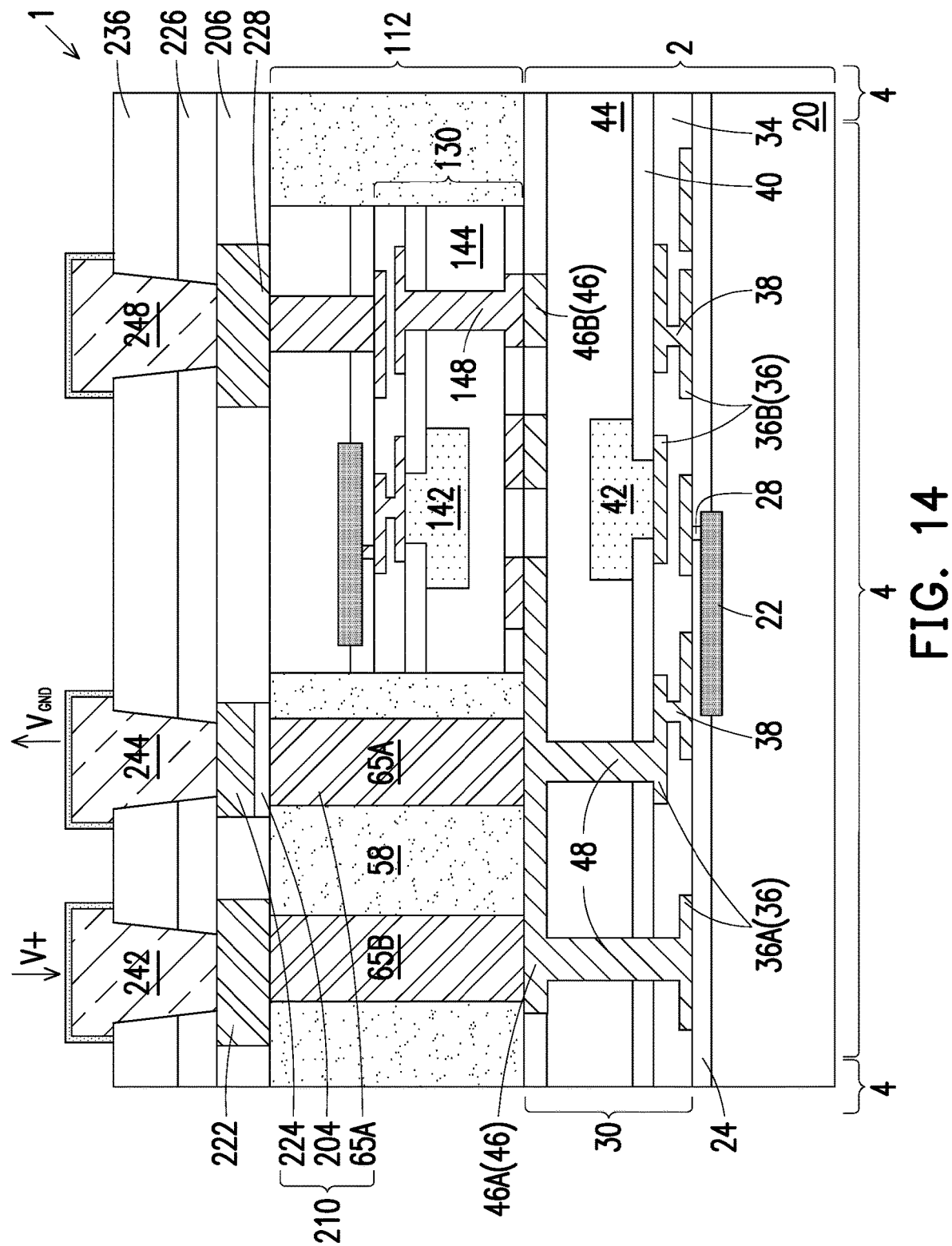

Referring to FIG. 14, a plurality of conductive (electrical) connectors 242, 244, and 248 are formed in the openings 232, 234, and 238, respectively. In some embodiments, the conductive connectors 242, 244, and 248 may be solder balls, metal pillars, controlled collapse chip connection (C4) bumps, micro bumps, electroless nickel-electroless palladium-immersion gold technique (ENEPIG) formed bumps, or the like. The conductive connectors 242, 244, and 248 may include a conductive material such as solder, copper, aluminum, gold, nickel, silver, palladium, tin, the like, or a combination thereof. In some embodiments, the conductive connectors 242, 244, and 248 include metal pillars (such as a copper pillar) formed by sputtering, printing, electro plating, electroless plating, CVD, or the like. The metal pillars may be solder free and have substantially vertical sidewalls. In some embodiments, a metal cap layer and/or an ENEPIG layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some alternative embodiments, the conductive connectors 242, 244, and 248 are formed by initially forming a layer of solder through evaporation, electroplating, printing, solder transfer, ball placement, or the like. Once a layer of solder has been formed on the structure, a reflow may be performed in order to shape the material into the desired bump shapes.

After forming the conductive connectors 242, 244, and 248, a package 1 of the present embodiment is accomplished. In the present embodiment, the package 1 is a SoIC package which includes a plurality of device dies such as RF dies and logic dies in the same package. The SoIC package may include device dies formed using different technologies and have different functions bonded to the same device die, thus forming a system. In detail, the package 1 includes the die 4 (also referred to as first die), the die 112 (also referred to as second die), the isolation region 58, the TDV 65A (also referred to as first through-via), and the capacitor structure 210. The die 112 may be bonded onto the die 4 in the face-to-face configuration. The isolation region 58 may be disposed on the die 4 and laterally encapsulate the die 112. The capacitor structure 210 may be disposed aside the die 112 and standing on the metal pad 46A of the die 4. The capacitor structure 210 may include the TDV 65A (also referred to as lower electrode) penetrating through the isolation region 58, the electrode layer 224 (also referred to as upper electrode) disposed on the TDV 65A, and the capacitor dielectric layer 204 disposed between the TDV 65A and the electrode layer 224 to separate the TDV 65A from the electrode layer 224.

In some embodiments, the package 1 may be bonded to the circuit substrate (not shown) via the conductive connectors 242, 244, and 248, thereby forming a chip-on-wafer-on-substrate (CoWoS) package structure or an integrated fan-out (InFO) package structure. The circuit substrate may include a redistribution layer (RDL) structure, an interposer, a circuit board, or the like. In the present embodiment, the conductive connector 244 (also referred to as first conductive connector) is configured to provide a ground voltage VGND to the electrode layer 224 of the capacitor structure 210. The conductive connector 242 (also referred to as second conductive connector) may be configured to provide a power voltage V+ (e.g., a positive voltage) to the TDV 65A of the capacitor structure 210. Specifically, the conductive connector 242 is electrically connected to the TDV 65A of the capacitor structure 210 through the conductive layer 222, the TDV 65B, and the metal pad 46A of the die 4. The conductive connector 248 may be configured to pass the signal between the die 112 and the circuit substrate (not shown). The number of the conductive connectors shown in FIG. 14 are not limiting and, therefore, fewer or additional conductive connectors may be possible.

Figure 15:
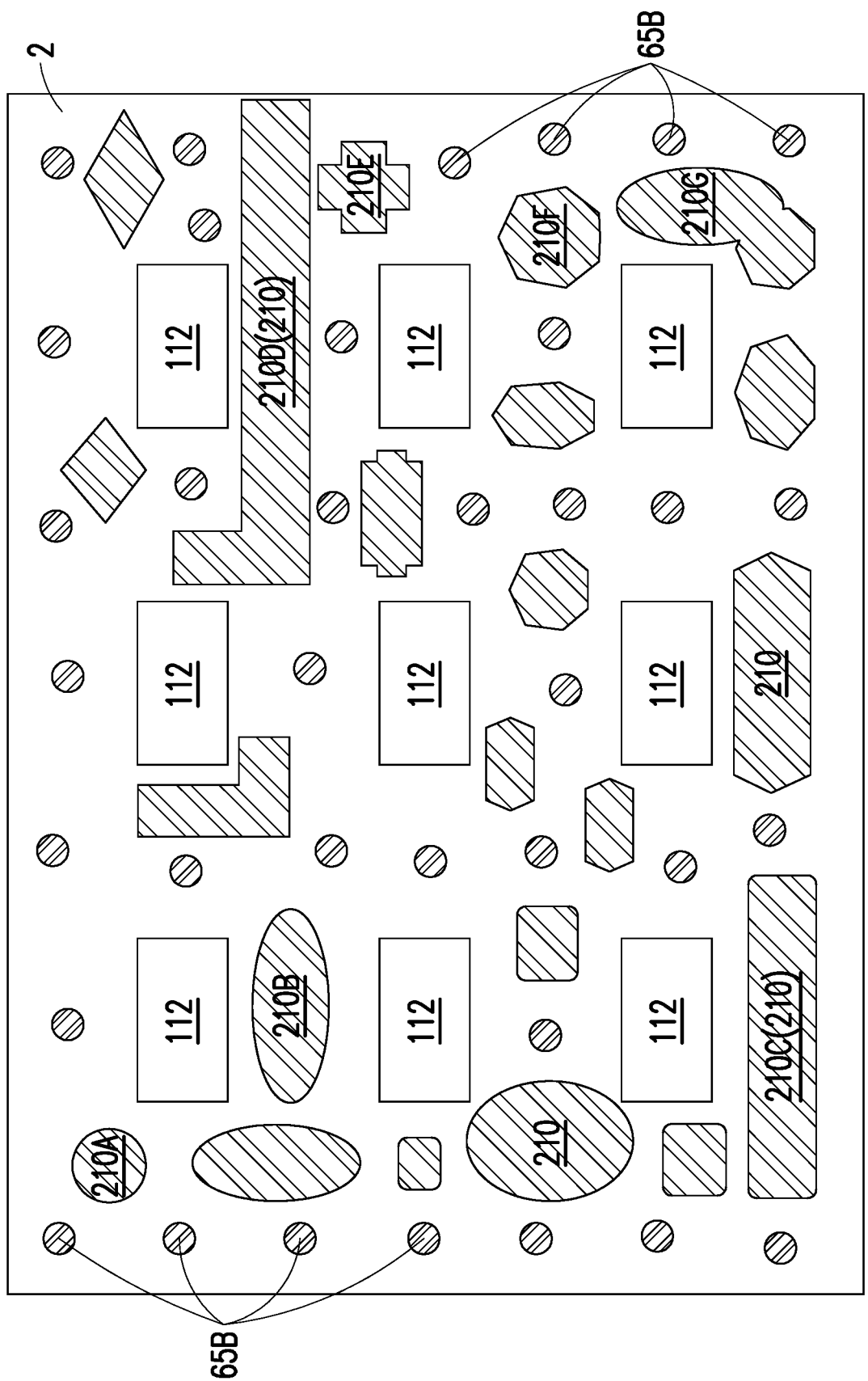
FIG. 15 illustrate a top view of the package of FIG. 14 in accordance with some embodiments.

FIG. 15 illustrate a top view of the package 1 of FIG. 14 in accordance with some embodiments.

From the perspective of the top view of FIG. 15, a plurality of top dies 112 are bonded onto the bottom wafer 2, a plurality of capacitor structures 210 (including 210A, 210B, 210C, 210D, 210E, 210F, 210G) are disposed on the bottom wafer 2 and aside the top dies 112, and a plurality of TDVs 65B are also disposed on the bottom wafer 2 and aside the capacitor structures 210. In some embodiments, the capacitor structures 210 may include various shapes in the top view, such as a circle (labeled as 210A), an ellipse (labeled as 210B), a rectangle (labeled as 210C), an L-shape (labeled as 210D), a cross (labeled as 210E), a polygon (labeled as 210F), an irregular shape (labeled as 210G), or the like. That is, the capacitance of the capacitor structure 210 in the package of the present embodiment can be adjusted according to the capacitor structure 210 with different shapes or areas, thereby achieving the needs of various customized products.

It should be noted that the present disclosure is directed to a method of forming a capacitor structure which may be integrated (or embedded) into a 3D IC packaging such as, for example, a system on integrate chip (SoIC) package. Integration of the capacitor structure into the SoIC package can reduce the interconnect length and the packaging size. According to some embodiments, the capacitor structure may include a variety of capacitor dielectric materials with different dielectric constants. In addition, the capacitor structure may have different capacitor plate areas. As a result, the capacitor structure formed with the method described in the present disclosure may exhibit a range of capacitance values. Further, compared to decoupling capacitors mounted on a substrate using the SMT technology, an integrated capacitor structure in a SoIC package—according to the embodiments described herein—can (i) reduce time delay due to a shorter interconnect length, (ii) offer higher capacitance and a larger capacitance range, (iii) reduce power consumption, (iv) improve operational speed, and (v) reduce the 3D IC packaging size. As such, the capacitance-tunable capacitor structure in the present embodiment has relatively shorter interconnect length and time delay which will be much more suitable for future advanced portable products, such as new-generation smart phones, flat panels, Internet of Things (IoT), and cloud computing devices, or the like.

Figure 16:
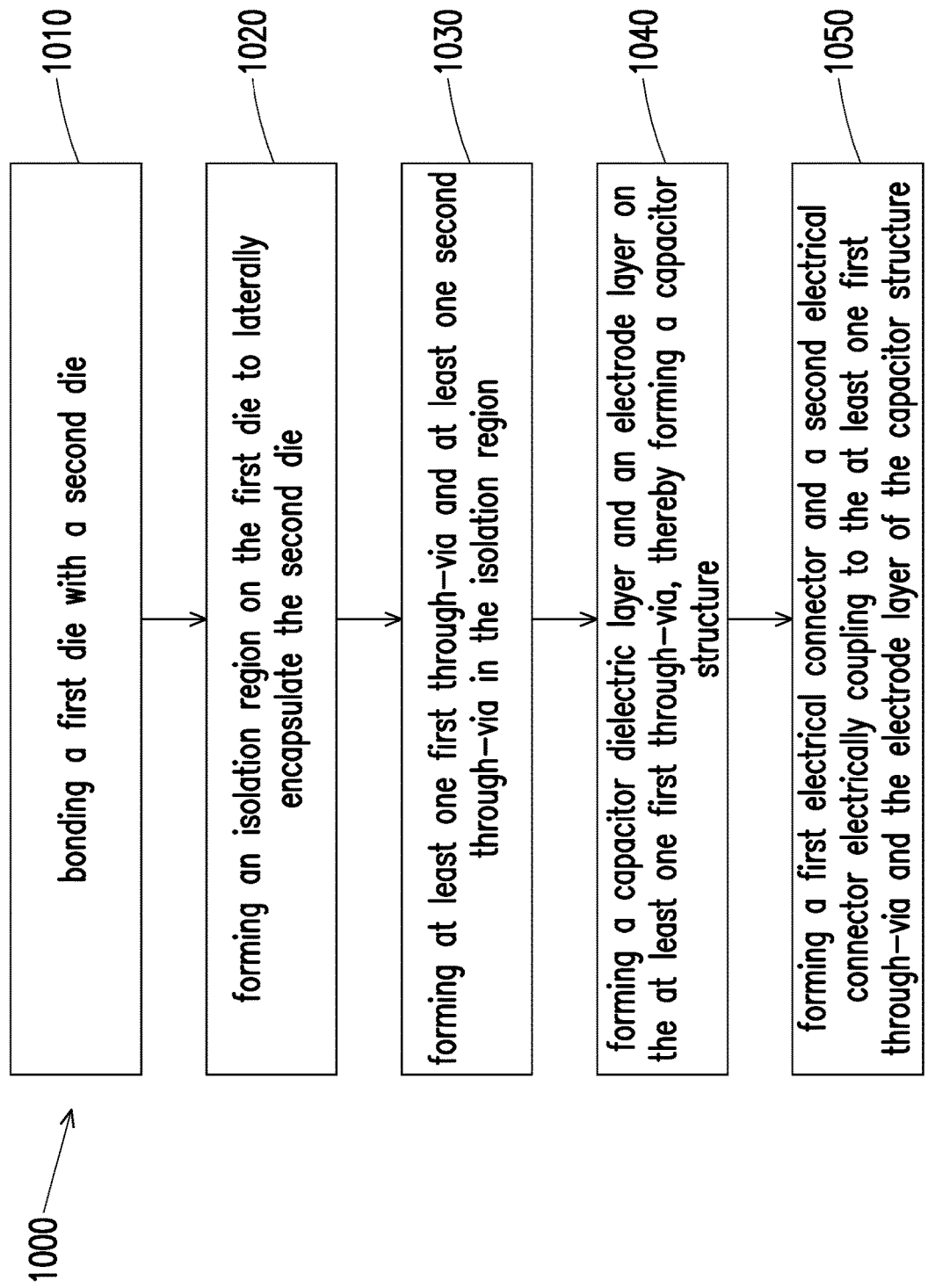
FIG. 16 illustrates a process flow for forming a package in accordance with some embodiments.

FIG. 16 illustrates a flow chart 1000 of a method of forming a package having a capacitor structure in accordance with some embodiments. While disclosed method 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. FIG. 16 may illustrate some embodiments of the method disclosed by FIG. 1 to FIG. 14.

Referring to FIG. 16, at block 1010, a first die is bonded onto a second die by a face-to-face configuration. FIG. 1 illustrates the cross-sectional view corresponding to some embodiments corresponding to block 1010.

Referring to FIG. 16, at block 1020, an isolation region is formed on the first die to laterally encapsulate the second die. FIG. 2 illustrates the cross-sectional view corresponding to some embodiments corresponding to block 1020.

Referring to FIG. 16, at block 1030, at least one first through-via and at least one second through-via are formed in isolation region. FIG. 3 to FIG. 4 illustrates the cross-sectional view corresponding to some embodiments corresponding to block 1030.

Referring to FIG. 16, at block 1040, a capacitor dielectric layer and an electrode layer are formed on the at least one first through-via, thereby forming a capacitor structure. FIG. 5 to FIG. 11 illustrates the cross-sectional view corresponding to some embodiments corresponding to block 1040.

Referring to FIG. 16, at block 1050, a first electrical connector and a second electrical connector are formed to electrically couple to the at least one first through-via and the electrode layer of the capacitor structure. FIG. 12 to FIG. 14 illustrates the cross-sectional view corresponding to some embodiments corresponding to block 1050.

According to some embodiments, a package includes: a first die; a second die bonded onto the first die; an isolation region disposed on the first die and laterally encapsulating the second die; at least one first through-via disposed aside the second die and penetrating through the isolation region; an electrode layer disposed on the at least one first through-via; and a capacitor dielectric layer disposed between the at least one first through-via and the electrode layer to separate the at least one first through-via from the electrode layer, wherein the at least one first through-via, the capacitor dielectric layer, and the electrode layer constitute a capacitor structure.

According to some embodiments, a method of forming a package includes: bonding a first die with a second die, wherein the second die is on the first die; filling a gap-filling material on the first die; removing a portion of the gap-filling material to expose the second die, wherein a remaining portion of the gap-filling material forms an isolation region; forming at least one first through-via and at least one second through-via penetrating through the isolation region to electrically couple to the first die; forming a capacitor dielectric layer and an electrode layer on the at least one first through-via, so that the at least one first through-via, the capacitor dielectric layer, and the electrode layer form a capacitor structure; and forming a first electrical connector and a second electrical connector electrically coupling to the at least one first through-via and the electrode layer of the capacitor structure.

According to some embodiments, a package includes: a first die; a second die bonded onto the first die; an isolation region disposed on the first die and laterally encapsulating the second die; a capacitor structure disposed aside the second die and standing on a metal pad of the first die, wherein the capacitor structure comprises: a lower electrode penetrating through the isolation region; an upper electrode disposed on the lower electrode; and a capacitor dielectric layer disposed between the lower electrode and the upper electrode to separate the lower electrode from the upper electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a first die;
   a second die bonded onto the first die;
   an isolation region disposed on the first die and laterally encapsulating the second die;
   at least one first through-via disposed aside the second die and penetrating through the isolation region;
   an electrode layer disposed on the at least one first through-via;
   a capacitor dielectric layer disposed between the at least one first through-via and the electrode layer to separate the at least one first through-via from the electrode layer, wherein the at least one first through-via, the capacitor dielectric layer, and the electrode layer constitute a capacitor structure; and
   a dielectric layer disposed on the second die, the isolation region, and the at least one first through-via to laterally surround the electrode layer and the capacitor dielectric layer.

2. The package according to claim 1, wherein the at least one first through-via comprises a plurality of through-vias connecting a bottom surface of the same capacitor dielectric layer.

3. The package according to claim 1, further comprising: at least one second through-via disposed aside the at least one first through-via and penetrating through the isolation region, wherein the first die comprises a metal pad to electrically connect the at least one first through-via and the at least one second through-via.

4. The package according to claim 3, further comprising:
   a first conductive connector disposed on the at least one first through-via, wherein the first conductive connector is configured to provide a ground voltage to the electrode layer of the capacitor structure; and
   a second conductive connector disposed on the at least one second through-via, wherein the second conductive connector is configured to provide a power voltage to the at least one first through-via of the capacitor structure.

5. The package according to claim 1, wherein the at least one first through-via has a top surface level with a top surface of the isolation region.

6. A method of forming a package, comprising:
   bonding a first die with a second die, wherein the second die is on the first die;
   filling a gap-filling material on the first die;
   removing a portion of the gap-filling material to expose the second die, wherein a remaining portion of the gap-filling material forms an isolation region;
   forming at least one first through-via and at least one second through-via penetrating through the isolation region to electrically couple to the first die;
   forming a capacitor dielectric layer and an electrode layer on the at least one first through-via, so that the at least one first through-via, the capacitor dielectric layer, and the electrode layer form a capacitor structure; and
   forming a first electrical connector and a second electrical connector electrically coupling to the at least one first through-via and the electrode layer of the capacitor structure.

7. The method according to claim 6, wherein the forming the capacitor dielectric layer and the electrode layer comprises:
   forming a capacitor dielectric material to cover the second die, the isolation region, the at least one first through-via, and the at least one second through-via;
   patterning the capacitor dielectric material to form the capacitor dielectric layer directly contacting a top surface of the at least one first through-via;
   forming a dielectric layer to cover the capacitor dielectric layer, the second die, the isolation region, and the at least one second through-via;
   patterning the dielectric layer to form a first opening exposing a top surface of the capacitor dielectric layer; and
   forming the electrode layer in the first opening.

8. The method according to claim 7, wherein the patterning the dielectric layer further comprises: forming a second opening exposing a top surface of the at least one second through-via.

9. The method according to claim 8, further comprising forming a conductive layer in the second opening, so that the second electrical connector is electrically connected to the at least one second through-via by the conductive layer.

10. The method according to claim 7, wherein the capacitor dielectric material comprises a high dielectric constant material with a dielectric constant greater than 3.9.

11. The method according to claim 7, wherein the capacitor dielectric material comprises $ZrO_2$, $Al_2O_3$, $ZrO_2$, $HfO_x$, $HfSiO_x$, $TiO_2$, $TaO_x$, or a combination thereof.

12. The method according to claim 6, wherein the at least one first through-via, the at least one second through-via, and the isolation region have a flush top surface.

13. The method according to claim 6, wherein the electrode layer has a width less than or equal to a width of the capacitor dielectric layer.

14. The method according to claim 6, wherein the first die and the second die are face-to-face bonded together by a hybrid bonding.

15. A package, comprising:
   a first die;
   a second die bonded onto the first die;
   an isolation region disposed on the first die and laterally encapsulating the second die;
   a capacitor structure disposed aside the second die and standing on a metal pad of the first die, wherein the capacitor structure comprises:
      a lower electrode penetrating through the isolation region;
      an upper electrode disposed on the lower electrode; and
      a capacitor dielectric layer disposed between the lower electrode and the upper electrode to separate the lower electrode from the upper electrode; and
   a dielectric layer disposed on the second die and the isolation region to laterally surround the upper electrode and the capacitor dielectric layer.

16. The package according to claim 15, further comprising at least one through-via standing on the metal pad of the first die, wherein the at least one through-via and the lower electrode are electrically connected to each other by the metal pad.

17. The package according to claim 16, further comprising:
   a first conductive connector disposed on the capacitor structure, wherein the first conductive connector is configured to provide a ground voltage to the upper electrode of the capacitor structure; and
   a second conductive connector disposed on the at least one through-via, wherein the second conductive connector is configured to provide a power voltage to the lower electrode of the capacitor structure.

18. The package according to claim 16, wherein the at least one through-via, the lower electrode, and the second die have the same height.

19. The package according to claim 15, wherein the capacitor dielectric layer comprises a high dielectric constant material with a dielectric constant greater than 3.9.

20. The package according to claim 15, wherein the capacitor dielectric layer comprises $ZrO_2$, $Al_2O_3$, $ZrO_2$, $HfO_x$, $HfSiO_x$, $TiO_2$, $TaO_x$, or a combination thereof.

* * * * *